United States Patent [19]

Griner et al.

[11] Patent Number: 4,780,590
[45] Date of Patent: Oct. 25, 1988

[54] LASER FURNACE AND METHOD FOR ZONE REFINING OF SEMICONDUCTOR WAFERS

[75] Inventors: Donald B. Griner, Madison; Frederick W. zur Burg, Huntsville, both of Ala.; Wayne M. Penn, Cartersville, Ga.

[73] Assignee: Penn Research Corporation, Kennesaw, Ga.

[21] Appl. No.: 800,227

[22] Filed: Nov. 21, 1985

[51] Int. Cl.[4] .............................................. B23K 26/00
[52] U.S. Cl. ........................... 219/121.65; 219/121.84; 219/121.8; 219/121.62; 219/121.61
[58] Field of Search ..... 219/121 LE, 121 L, 121 LM, 219/121 LA, 121 LF, 121 LH, 121 LJ, 121 LB, 121 LQ, 121 LW, 121 FS, 121 LP; 148/1.5; 427/53.1

[56] References Cited

U.S. PATENT DOCUMENTS

| | | | |
|---|---|---|---|
| 3,778,585 | 12/1973 | Mallozzi et al. | 219/121 L QX |
| 4,309,225 | 1/1982 | Fan et al. | 427/53.1 X |
| 4,322,253 | 3/1982 | Pankove et al. | 219/121 L X |
| 4,370,175 | 1/1983 | Levatter | 427/53.1 X |
| 4,446,169 | 5/1984 | Castle et al. | 427/53.1 |

OTHER PUBLICATIONS

Tan, "Individual Chip Joining Monitor," *IBM Technical Disclosure Bulletin*, vol. 21, No. 6, p. 2551, Nov. 1978.

Rhodes, "Semiconductor Chip Leveling Apparatus," *IBM Technical Disclosure Bulletin*, vol. 21, No. 10, pp. 4121-4122, Mar., 1979.

*Primary Examiner*—C. L. Albritton
*Attorney, Agent, or Firm*—Antonelli, Terry & Wands

[57] ABSTRACT

A method of zone refining a crystal wafer (116 FIG. 1) comprising the steps of focusing a laser beam to a small spot (120) of selectable size on the surface of the crystal wafer (116) to melt a spot on the crystal wafer, scanning the small laser beam spot back and forth across the surface of the crystal wafer (116) at a constant velocity, and moving the scanning laser beam across a predetermined zone of the surface of the crystal wafer (116) in a direction normal to the laser beam scanning direction and at a selectible velocity to melt and refine the entire crystal wafer (116).

15 Claims, 4 Drawing Sheets

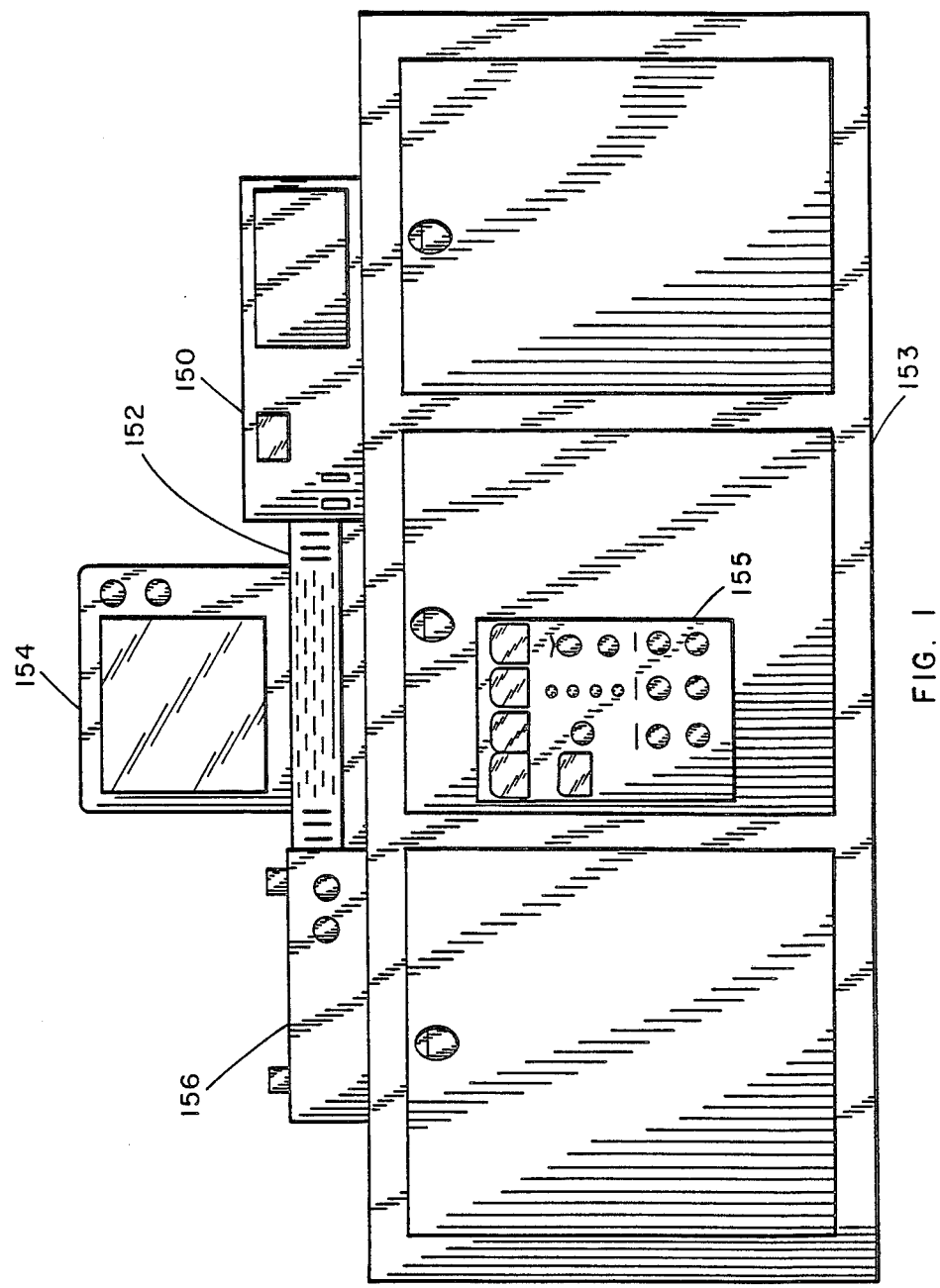

… …

LASER FURNACE AND METHOD FOR ZONE REFINING OF SEMICONDUCTOR WAFERS

ORIGIN OF THE INVENTION

The invention described herein was made in part in the performance of work under a NASA contract, and is subject to the provisions of Public Law 96-517 (35 USC 200–211).

TECHNICAL FIELD

The invention relates generally to laser furnace technology and more particularly to a furnace for use in a low or zero gravity environment such as a spacecraft and employing a laser beam to heat, melt, and thereby refine a crystal wafer by scanning the laser beam across the crystal wafer by zones.

BACKGROUND OF THE INVENTION

For many years various efforts have been made to design new and better furnaces for zone refining of crystal wafers in a low or zero gravity environment by the generation of very precise melt zones with precision control of temperature gradients around the melt zone, without which portions of the crystal wafer might develop undesirable molecular and/or crystalline structural changes which could not be properly refined. The refining process in space (zero gravity) allows better control of thermal convection currents, unusual and undesirable melt zones, and more convenient ways to hold the crystal wafers without physically touching them.

It is anticipated that small, unusual type crystals, not yet even discovered, will be required for advanced detectors and semiconductors devices. Only experiments in a very low or zero gravity environment will reveal what possibilities exist and are practical.

The current problem is to provide a furnace which will be adequate to meet the rigid condition requirements of such a zone refining process.

BRIEF SUMMARY OF THE INVENTION

A primary object of the invention is to provide a laser furnace which can be used in a low or zero gravity environment to zone refine a crystal wafer with a scanning laser beam and with precision control of the temperature gradients around the melt zone.

Another object of the invention is to provide a laser furnace for use in space and which is capable of scanning a crystal wafer to create very precise melt zones in the crystal wafer.

Yet another object is to provide a laser furnace for use in space which is capable of scanning a crystal wafer with a high power laser beam to generate very precise melt zones with precision control of the temperature gradients around the melt zone.

Still another object of the invention is to provide an improved laser furnace for use in space generally.

In one preferred form of the invention there is provided a method of zone refining a crystal wafer comprising the steps of focusing a laser beam to a small spot of selectable size upon the surface of the crystal wafer at an angle of maximum absorption, scanning the small laser beam spot back and forth across the surface of the crystal wafer at a constant velocity to generate a melt zone, and moving the melt zone along a predetermined length of the surface of the crystal wafer in a direction normal to the laser beam scanning direction and at a selectable velocity.

BRIEF DESCRIPTION OF THE DRAWINGS

FIGS. 1 and 1a together show a structural schematic representation of the invention with most of the more important elements shown therein, including a very general representation of a three section cabinet containing the laser generating means, the electronic circuits and controls therefor, and also shows the computer system components;

DETAILED DESCRIPTION OF THE INVENTION

Figure 1A:
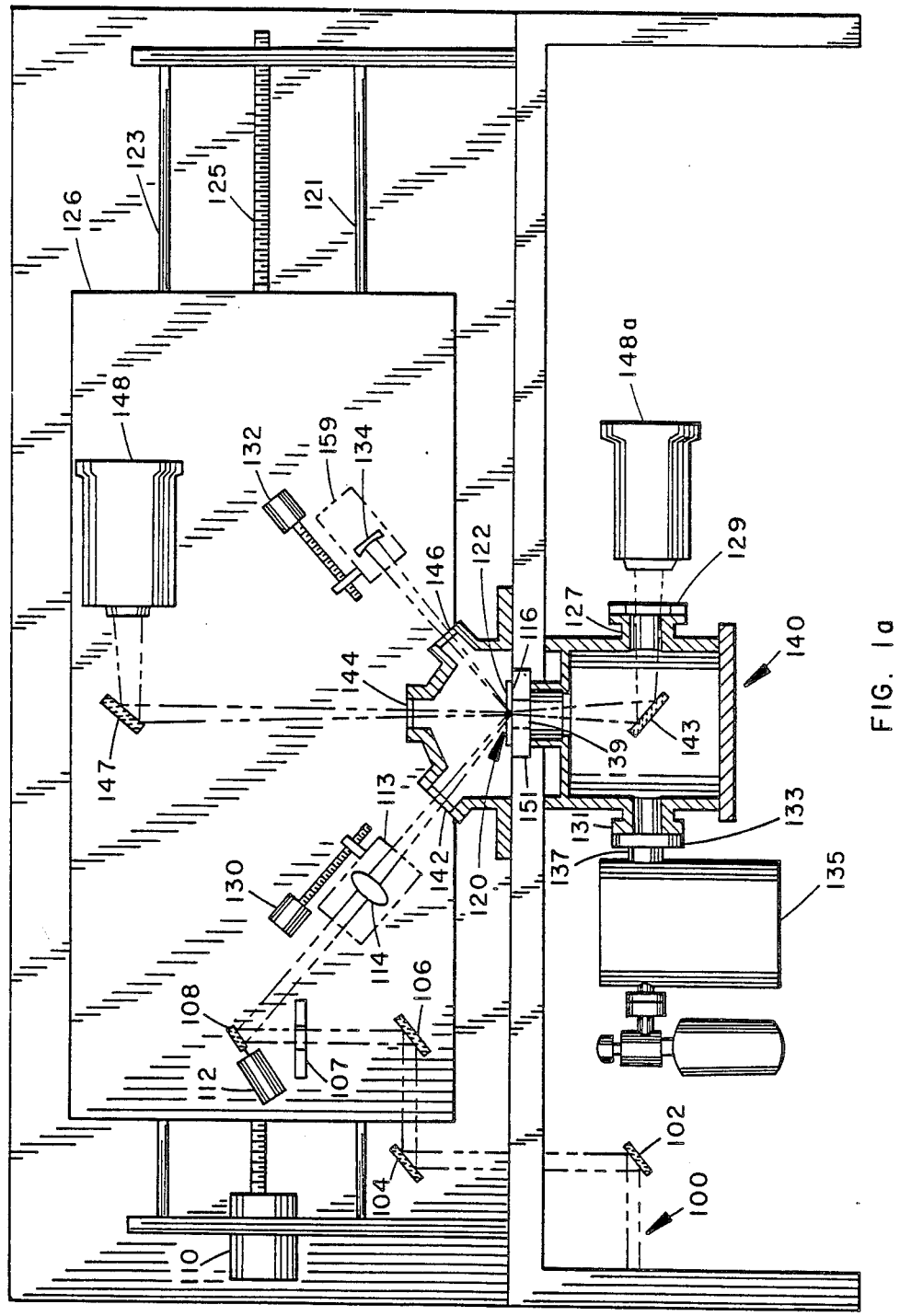

A block diagram of the system is shown in FIG. 1a. The laser beam 100 is directed through three beam steering mirrors 102, 104, and 106 to the galvanometer 112-driven scan mirror 108 which is mounted within the stepper motor 110-driven linear translation stage 126. The scan mirror 108 directs the laser beam 100 through a focusing lens 114 that focuses the laser beam down to a spot 120 on the sample surface 122 of crystal wafer 116. The angle that the beam 100 strikes the surface 122 can be changed by remounting the scan mirror 108 and lens 114 at various predrilled holes (not shown) within the translation stage 126. The change in angle is important to increase laser power absorption by the crystal sample by impinging at or near the Brewster angle.

The lens 114 used to focus the beam 100 is mounted on a small, stepper motor 130-driven linear-translation stage 113 to allow control over the focused beam spot 120 size. By moving the stage 113 the beam can be defocused to heat a larger area of the wafer 116 at any one instant in time. The laser beam 100 at the lens 114 is about 1 cm in diameter and the lens 114 can have a focal length of 24.5 cm. By measurement, the sharpest focus of the laser beam gives a spot 120 about 0.5 mm RMS in diameter, which is larger than a perfect diffraction limited spot by about a factor of two.

Opposite the lens 114 to the right in FIG. 1a is a second stepper motor 132-driven linear stage 159. It is used either to hold an absorber 134 to trap the reflected beam 100 or to position a concave mirror (in place of absorber 134) to focus the beam 100 back down to the surface 122 to increase the energy absorbed in the sample 116. When a concave mirror is used as element 134 it is driven by stepper motor 132 (via translation stage 159) to produce a spot that scans back and forth 180° out of phase with the original spot 120, but in the same zone area.

A vacuum chamber 140 holds the sample 116. The chamber 140 is designed to allow the beam 100 to enter at 45° or at normal incidence via salt windows 142, 144, and 146. The normal mode of operation is to send the laser beam in at 45° and to view the sample through the top salt window 144 with a pyromometer 148 for temperature measurements. The vacuum chamber 140 does not move and the small salt windows 142 and 146 allow only a 2 cm scan distance on the sample 116.

It should be noted that, if desired, the glassed-in port 129 can be used to observe the bottom surface of the crystal wafer sample 116. If desired the first pyrometer 148 or a second pyrometer 148a can be mounted as shown to view the sample 116 through port 129 by means of reflection off fold mirror 143.

A vacuum ion pumping system 135 is connected to vacuum chamber 140 through tube 137 and aligned orifices in flanges 133 and 131. The crystal wafer 116 is placed over an orifice 139 in the middle plate 151.

The Pyronometer 148 field of view is linearly movable both in the X and Y coordinates by two galvanometers which drive mirror 147 (galvanometers not shown but similar to galvanometer 112) to measure the heat generated at any given desired spot and at any desired time during the scanning period of the laser beam.

The entire assembly 126, including galvanometer 112, focusing lens 114 and its carrier translation stage 113, spherical mirror (or absorber) 134, and its carrier stage 159, stepper motor drives 130 and 132, and pyronometer 148 and its galvonometer driven mirror 147 are all movable together in unison on threaded carrier shaft 125 which is driven by stationary stepper motor drive 110. Rods 123 and 121 function to guide the movement of stage 126 in a uniform, translational motion.

The triangular pattern of the laser beam path on the crystal wafer 116 is a result of the constant velocity, linear motion of the translation stage 126 in a horizontal direction X in the plane of FIG. 1a and with it the same component of constant velocity linear motion of the laser beam spot on the wafer 116, combined with the simultaneous linear back and forth scanning motion of the laser beam 100 resulting from the movement of the galvonometer driven mirror 108 which is repetitious over a single line that is stationary with respect to the translation stage 126 in the direction X in which it is moving, but perpendicular to the direction X.

Figure 2:
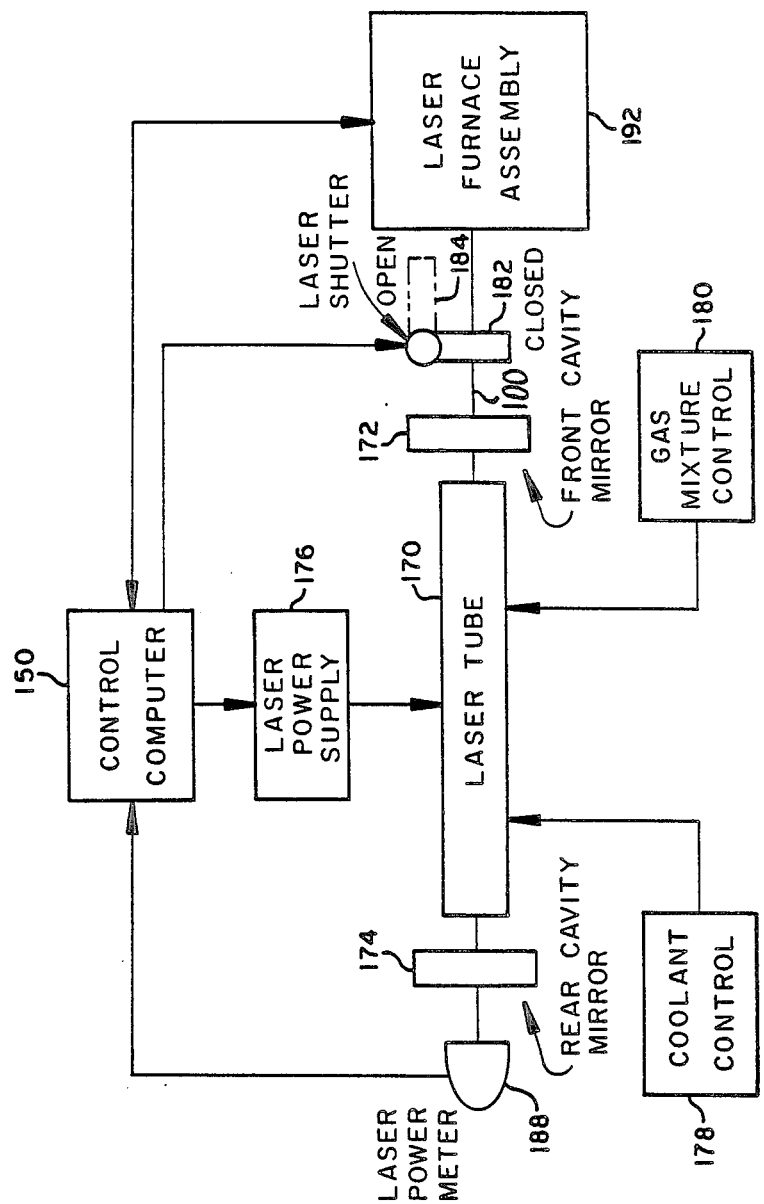
FIG. 2 is a more detailed showing of the generation of the laser beam, the means for measuring the intensity of the beam, and shutter means for blocking the beam from entering the surface portion of the system when desired.

All parts of the scanning system are controlled by a microprocessor control computer 150 of FIG. 1. The computer 150, accessible by keyboard 152, can be a single board system based on a Motorola 6809 microprocessor, and can use the FLEX operating system. XBASIC can be used for most of the programming but some routines are preferably written in assembly language. The system has a real time clock, analog to digital (A/D) circuits to read the laser power meter 188 of FIG. 2 and drivers for the stepper motors, scan mirrors, and laser beam shutter 182 (FIG. 2). Peripherals can include a keyboard 152, a CRT display 154, a printer 156, and a dual 5.25 double sided, double density floppy disc drives (not shown in FIG. 1). The major components of the system were obtained, assembled, and supplied by Penn Research Corporation (PRC) of Kennesaw, Ga.

FIG. 2 shows generally how the $CO_2$ laser beam 100 is generated and fits into the overall system. A laser tube 170 powered by laser power supply 176 is positioned between a rear cavity mirror 174 and a front cavity mirror 172, between which the laser beam is reflected back and forth and generates itself. Both cavity mirrors 174 and 172, however, will pass some of the laser beam with front cavity mirror 172 passing more of the laser beam than rear cavity mirror 174.

That portion of the generated laser beam passing through front cavity mirror 172 will enter the laser furnace assembly 192 of FIG. 2 when the lead shutter 182 is in its open position 184. A smaller amount of the laser beam will enter power meter 188 to indicate the laser beam intensity or power. Both laser power meter 188 and shutter 182 are controlled by computer 150 as is the laser furnace assembly 192 and the laser power supply 176. The laser tube coolant control 178 and the gas mixture control 180 are controlled by dials and meters on the control panel 155 of FIG. 1 which is positioned on the front of the cabinet 153 of FIG. 1.

Two major experiments were performed to verify the operation of the equipment shown in FIGS. 1, 1a and 2. One of these experiments used silicon as the semiconductor material and the second experiment used a nickel based super alloy (MARM-246) as a metallic crystal. Silicon was selected because its properties were well known and much experimental data was available relating to the use of carbon dioxide lasers to melt or cut the silicon material. Nickel based super alloys were of particular interest because of their importance in rocket engines and at high temperatures in general.

In preparation for the experiments the carbon dioxide laser system of FIGS. 1 and 1a with the laser beam 100 under computer control was placed into operation. The laser beam 100 supplied over 50 watts on a sample surface focused to a spot as small as 0.5 mm. The beam was linearly scanned at frequencies selectively ranging from 0.04 to 60 Hz. The width of the scan was made expandable up to 1.8 cm and the scan zone moved at speed ranging from 0.001 to 25 cm/sec. The basic goals for the beam control were thus achieved.

Initial attempts to melt the silicon wafer revealed a major problem with the system which was determined to be an excessive loss of laser power through the optical train. All of the initial beam alignment had been previously done at low power settings and it was not at first realized that when the laser power was increased the beam diameter also increased. The scan mirror 108 of FIG. 1a has a circular shaped graphite absorber 107 positioned to trap the laser beam 100 if the alignment moves. Because of the doughnut shaped mode assumed by the laser when the beam diameter increased the graphite absorber 107 blocked the outside diameter thereof and the power transmitted to the sample actually decreased. When the situation was finally realized, the hole in the graphite absorber 107 was increased and a larger scan mirror 108 was placed on galvanometer 112 of FIG. 1. With that remedy the silicon wafers were melted for the first time. It fact, it was discovered very quickly that any power setting over 50 watts heated up the sample too rapidly and the silicon wafer shattered. Measurements of the optical system transmission efficiency to determine the maximum power that could be placed on the silicon wafer sample revealed that all the mirrors reflected more than 99 percent of their received power but that about 20 percent of the laser power was lost at the focusing lens 114 due to surface reflection. Therefore, at any reading of the power meter 188 (FIG. 2) the actual power on the surface 122 of crystal wafer 116 was 20 percent less.

The silicon wafer samples used in the experiments were integrated circuit wafers 24 cm in diameter and 13 mils thick. At a 45° angle of incidence the wafers transmitted 50 percent of the incident energy and reflected 37.5 percent thereof, leaving 12.5 percent to actually heat up the crystal wafer material. As the temperature of the sample increased, the absorption increased. The data recorded agreed very well with published data. At power settings of 40 watts, melt zones 5 mm wide were generated and moved along the sample. The main translation stage 126 velocity had to be slower than 2 mm/sec or the melt zone could not be maintained.

Attempts to melt the nickel/based super alloy metal crystals were unsuccessful. The laser power of the particular form of the invention was insufficient to melt the size sample available. These samples were rods about 5 mm in diameter and 49 mm long. The high reflectivity of the metal indicated that more than a hundred watts might be required to initiate the melt.

In operating the system the following procedures were used. The carbon dioxide laser beam was generated as shown in FIG. 2. However, the specifics of the procedures for generating the carbon dioxide type lasers used herein are well known in the art and will not be described herein other than in the general manner shown in FIG. 2. Reference is made to the following publications for further information relating to $CO_2$ lasers: (1) "American Institute of Physics Handbook", Dwight E. Gray, Coordinating Editor, McGraw-Hill Book Company, Colonial Press, NY, Third Edition 1972, Section 6, Page 326 and (2) "Introduction to Laser Physics", Bela A. Lengyel, Professor, San Fernando Valley State College, John Wiley and Sons, Inc., New York, 1966, Chapter V, Page 209, all of which are incorporated herein by reference.

Once the laser is on and operating the shutter 182 (FIG. 2) has to be switched open to position 184 to allow the beam to reach the scanning optics, as shown in FIG. 1a. When the shutter 182 is closed the laser beam 100 is blocked by a metal trap which is shutter 182. Even at full laser power the shutter 182 will trap the laser beam 100 continuously without overheating. The power meter 188 (FIG. 2) is located immediately behind the rear cavity mirror 174 and operates by measuring the small percentage of the laser beam transmitted by the rear cavity mirror 174. Therefore, the power meter 188 will read the correct power even when the shutter 182 is closed.

The laser power can be optimized by adjusting the cavity mirrors 174 and 172 at each end of the laser 170 by rotating each of the two mirrors about two orthogonal axes by suitable means (not shown). The maximum power is obtained when the cavity mirrors are set for a "doughnut" mode (TEM01) of operation of the laser beam. Thermal image plates can be manually placed in the path of the laser beam to locate the invisible carbon dioxide laser beam and determine when the best alignment is achieved. A small ultra-violet lamp is used to illuminate the thermal image plates causing them to fluoresce. The laser beam will cause the fluorescence to cease and appear as a dark image on the thermal image plates.

To operate the computer 150 (FIG. 1), the power is turned on and a reset button (not shown) is pushed. The computer 150 is then instructed to load the operating system. When the operating system is loaded the computer will give the time and date display the FLEX system READY MESSAGE. The control program is written in basic so the basic language must be loaded. The operator loads basic by typing "XBASIC" and hitting the carriage return key. When the READY message is displayed the actual control program is loaded by typing the code word "load NASA3" and again hitting the carriage return key. Once the READY message is again displayed the operator can run the control program by typing "RUN" and once again hitting the carriage return key.

Figure 3:
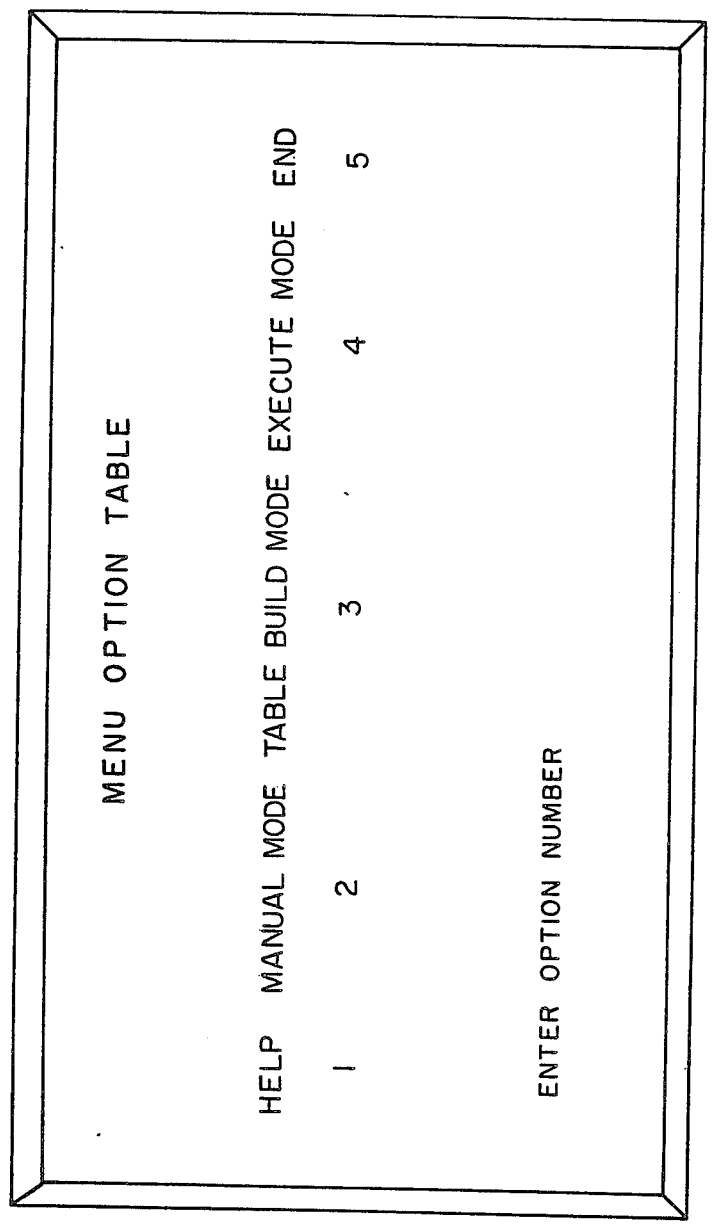
FIG. 3 shows the Menu Table of the computer portion of the system.

The control program first displays a Menu Option table. An example is shown in FIG. 3. An option is selected by entering the number below each selection.

To make an experimental run the parameters must first be entered and stored in a data table. An example of a typical data table is shown

| I | II |
| --- | --- |
| (A) ASSEMBLY STAGE START POSITION | 1.0001 cm. |
| (B) ASSEMBLY STAGE FINAL POSITION | 9.0001 cm. |
| (C) ASSEMBLY STAGE VELOCITY | 100 (par)** |
| (D) LENS STAGE POSITION | 1.4998 cm. |
| (E) MIRROR STAGE POSITION | 1.4998 cm. |
| (F) PRIMARY SCANNER FREQUENCY | 1000 (par) |
| (G) PRIMARY SCANNER AMPLITUDE | 500 (par) |
| (H) PYROMETER X AXIS FREQUENCY | 1 (par) |
| (I) PYROMETER X AXIS AMPLITUDE | 1 (par) |
| (J) PYROMETER Y AXIS FREQUENCY | 1 (par) |
| (K) PYROMETER Y AXIS FREQUENCY | 1 (par) |
| (L) INITIAL WAIT FOR MELT ZONE | 32000* |
| (M) NUMBER OF TIMES TO EXECUTE RUN* | 1 |

*Number of dummy loops
**(par) = parameter
Example of data table.

The data table build option allows the operator to generate a new data table whenever desirable. The computer will ask for a name for the data file and than ask for each parameter one at a time. After the values are entered the computer will ask if the file is to be saved or printed. When the file is saved, the menu option will again be displayed and the operator can select the Execute mode for the table option. The computer will ask for the file name to run and then ask if any changes to the parameters are required. By entering the letter beside the parameter the operator can change the table before running it. There is also an option to save or print the parameters as they are now on the screen. The computer will automatically store any table on disc after the command is actually given to run the table. The disc file is called LASTRUN and is insurance that the last ran data can be retrieved.

The example of the typical data selected by the operator under the TABLEBUILD MODE of the MENU of FIG. 3, as shown in the above Table, will now be discussed in some detail.

The assembly stage 126 (FIG. 1a) start and stop positions in rows A and B of the above Table are in centimeters as are the positions of the lens 114 stage in row D and the absorber (or mirror) 134 in row E. The given measurements of the assembly stage start and stop positions are relative to the zero drive position of stepper motor drive 110, i.e., the extreme left position, and the measurements of the positions of the lens 114 and mirror 134 stages are relative to zero left and right extreme positions of stepper motor drives 130 and 132, respectively.

The assembly stage 126 velocity of row C in FIG. 6 is in milliseconds which is represented and translated by the parameter 100 set in a specific memory location in the computer RAM. The primary scanner 108 (FIG. 1a) frequency and amplitude are also represented by parameter numbers which are set in designated memory locations in the computer RAM and translated by the computer into time frequency and amplitude of the galvanometer 112.

Rows H, I, J, and K represent the frequencies and amplitudes of two galvanometers (not shown) that can be employed to drive the following mirror 147 along coordinate X and Y axis in much the same way as galvanometer 112 drives the scanning mirror 108.

The two additional galvanometers used to drive mirror 147 would be under control of the system computer 150 and would permit the pyronometer 148 to monitor the heat on any spot on the crystal wafer surface.

The numerals "1" in column II of rows H through K are purely arbitrary and meaningless parameters. If the two additional galvanometers for driving mirror 147 of FIG. 1 were actually used, meaningful parameters would be placed in rows H through K of column II.

In row L the initial wait for melt zone is selected as 32000, which represents the number of dummy scan loops that the computer makes to allow the zone on the crystal wafer being scanned to melt before the assembly stage 126 begins to move. The number 32000 is a parameter representing a given time interval and is set into a given memory position in RAM by the operator. Row M represents the number of times the melt (scan) zone will be moved through the crystal wafer sample.

In the table below there is shown the relationship between ten choices of values in column II ranging from 50 to 32000 and the corresponding velocity of the stage 126 (FIG. 1a). The value 50, for example, placed in a preselected memory location of the computer, results in a velocity of 5.00 millimeters per second (mm/sec) of translation stage 126 (FIG. 1). The value 2000 (column II, row 6) of the above Table results in a velocity of 0.171 mm/sec of stage 126. The start and stop positions of stage 126 are predetermined by the values selected for rows A and B of the above Table.

| I<br>LINEAR STAGE ITEM | II<br>CALIBRATION VALUE | III<br>SPEED CALIBRATION SPEED MM/SEC |
| --- | --- | --- |
| 1. | 50 | 5.00 |
| 2. | 100 | 2.90 |
| 3. | 200 | 1.575 |
| 4. | 500 | 0.664 |
| 5. | 1000 | 0.338 |
| 6. | 2000 | 0.171 |
| 7. | 5000 | 0.069 |
| 8. | 10000 | 0.034 |
| 9. | 20000 | 0.017 |
| 10. | 32000 | 0.0108 |

Table relating main translation table input parameters to table speed.

The table below shows the relation of the scan mirror input parameter entered in row F of the data table, to the actual scanning frequency in Hz of the scanning mirror 108 (FIG. 1). Thus, for example, in the table the scan mirror input parameter value of 1000, in row II, represents an actual scanning frequency of 1.25 Hz. The scan mirror input parameter value 1000 is preselected by the operator and placed in row F of the data bank. As mentioned above in connection with the data table, the amplitude of the primary scanner mirror 108 is represented by the parameter 500.

| SCANNER FREQUENCY CALIBRATION | | |
| --- | --- | --- |
| I<br>ITEM | II<br>VALUE | III<br>SCANNER MIRROR FREQUENCY (HZ) |
| 1. | 10 | 125.0 |
| 2. | 20 | 62.5 |
| 3. | 30 | 41.7 |
| 4. | 40 | 31.2 |
| 5. | 50 | 25.0 |
| 6. | 60 | 20.8 |
| 7. | 70 | 17.8 |
| 8. | 80 | 15.6 |
| 9. | 90 | 13.9 |
| 10. | 100 | 12.5 |
| 11. | 1000 | 1.25 |
| 12. | 10000 | 0.125 |

Table relating scan mirror input parameter to scan frequency

The sequence of events that happen after the instruction to execute the RUN the control program is entered is listed below:

(1) The lens and reflector stages are positioned to the locations specified in the data table. Both motors appear to run at the same time.

(2) The main translation stage 126 is positioned to the zero reference point, i.e., driven to the extreme left position in FIG. 1a.

(3) The scan mirror 108 is started. (The shutter is not opened.)

(4) The main translation stage 126 is moved to specified start position.

(5) The shutter 182 is opened and the laser beam is allowed to strike the surface 122 of wafer sample 116.

(6) The main translation stage 126 is held stationary for the specified wait period.

(7) The main translation stage 126 starts to move and drives to the final position specified in row B of FIG. 6.

(8) The shutter 182 is closed.

(9) The translational stage 126 is driven back to the zero reference position if it is the last run or to the melt zone start location if additional cycles are specified.

(10) The cycle is repeated the specified number of times specified in row M of the data table.

A galvanometer 112 is used to drive the scan mirror 108 instead of an oscillating band so that the linear triangularly shaped sweep as depicted below can be produced.

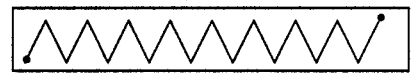

NOTE:
SCAN IS TRIANGLE WAVE TO GIVE EQUAL TIME AT EACH SPOT ON THE SAMPLE. IN ACTUAL OPERATION THE BACK AND FORTH SCAN WOULD APPEAR AS A LINE THAT IS TRANSLATED ALONG THE SAMPLE.

The waveform generated by the computer is a triangularly shaped wave and the galvanometer 112 will faithfully follow the signal up to about 60 Hz. Above 60 Hz the scan becomes more and more sinewave shaped as the frequency is increased. The scan shown was achieved onto crystal wafer 116 below 60 Hz.

The laser power is variably controlled by changing the current flowing through a current control variable modulator (not shown). The actual power obtained for any one setting varies from day to day for reasons which have not been established but is probably related to the gas mixture in which the laser is generated and temperature conditions. The graph below shows two curves which were obtained during attempts to calibrate the dial settings of the meters (not shown) indicating the laser current and resulting laser power. It is recommended that a dial setting less than 20 not to be used because dial settings lower than 20 produce high voltages across the laser tube 170 (FIG. 2) which may be high enough to break down the insulators that isolate the tube 170 from ground. Laser power settings above 80 on the dial are also not recommended due to the high currents through the tube 170. However, although the laser is rated at 85 watts it actually has a maximum power ranging from 70 up to 95 watts. Obviously other laser constructions can be employed which will provide a larger range of power and particularly a substantially greater maximum power setting.

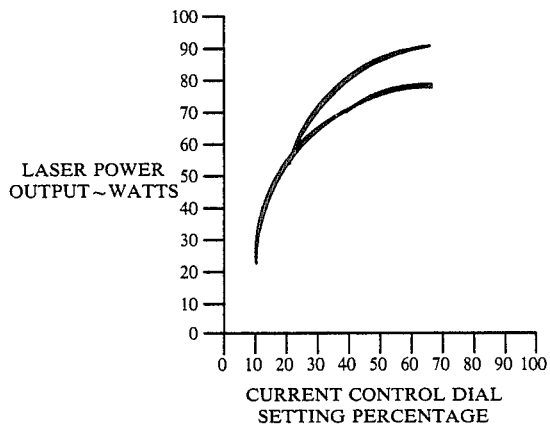

Control of the laser power may be accomplished by manual adjustment as described above or by automatic, real-time control through computer 150, using feedback signals from pyrometer 148 and from laser power meter 188 or from computer memory using previously programmed parameter tables.

It is to be understood that the form of the invention described and claimed herein is but one preferred embodiment thereof and that other embodiments of different parameters will be apparent to one of ordinary skill in the art.

We claim:

1. A method of zone refining a crystal wafer comprising the steps of:
   generating a laser beam having a selectable power wattage:
   focusing said laser beam to a small, selectable spot size on said crystal wafer;
   scanning said laser beam back and forth across said crystal wafer in a single straight line at a constant velocity; and
   moving said scanning laser beam across a predetermined zone of said crystal wafer in a direction normal to the scanning direction of said laser beam and at a selectable velocity compatible with the scanning rate of said laser beam to uniformly melt a zone in said crystal wafer; and wherein said laser beam is directed upon the surface of said crystal wafer at an angle not greater than 75° with respect to the surface of said crystal wafer; and
   a portion of said laser beam is reflected from the surface of said crystal wafer and is returned to said surface of said crystal wafer to scan said crystal wafer a second time in a pattern similar to that of the scanning pattern produced by the original, unreflected laser beam but in a direction 180° out of phase with the original scanning pattern.

2. A method as described in claim 1 comprising the further step of controllably varying the power wattage of said laser beam in response to real-time signals.

3. A method as in claim 1 and comprising the further steps of:
   placing said crystal wafer in a chamber drawn down to a vacuum prior to scanning said crystal wafer with said laser beam; and
   placing a window in said vacuum chamber to enable said laser beam to pass therethrough and impinge upon the surface of said crystal wafer in said scanning pattern.

4. A method of zone refining a crystal wafer comprising the steps of:
   focusing a laser beam to a small spot of selectable size on said crystal wafer;
   scanning said small laser beam spot back and forth across said crystal wafer at a constant velocity, and
   moving said scanning laser beam across a predetermined zone of said crystal wafer in a direction normal to said laser beam scanning direction and at a selectable velocity; and wherein said laser beam is directed upon the surface of said crystal wafer at an angle not greater than 75° with respect to surface of said crystal wafer; and
   a portion of said laser beam which is reflected from the surface of said crystal wafer is returned to said surface of said crystal wafer to scan said crystal wafer a second time in a pattern similar to that of the scanning pattern produced by the original, unreflected laser beam but in a direction 180° out of phase with the original scanning pattern.

5. A method as in claim 4 and comprising the further steps of:
   placing said crystal wafer in a chamber drawn down to a vacuum prior to scanning said crystal wafer with said laser beam; and
   placing a window in said vacuum chamber to enable said laser beam to pass therethrough and impinge upon the surface of said crystal wafer in said scanning pattern.

6. A method of zone refining a crystal wafer comprising the steps of;
   scanning a crystal wafer back and forth over the same absolute path with a laser beam focused to a small spot on the surface of said crystal wafer; and
   moving said crystal wafer relative to said focused laser beam on said crystal wafer in a direction substantially normal to the direction of said scanning path; and wherein said laser beam is directed upon the surface of said crystal wafer at an angle not greater than 75° with respect to the surface of said crystal wafer; and
   a portion of said laser beam which is reflected from the surface of said crystal wafer is returned to said surface of said crystal wafer to scan said crystal wafer a second time in a pattern similar to that of the scanning pattern produced by the original, unreflected laser beam but in a direction 180° out of phase with the original scanning pattern.

7. A method of zone refining a crystal wafer comprising the steps of:
   scanning a crystal wafer back and forth over the same absolute path with a laser beam focused to a small spot on the surface of said crystal wafer; and
   moving said crystal wafer relative to said focused laser beam on said crystal wafer in a direction substantially normal to the direction of said scanning path; and wherein said laser beam is directed upon the surface of said crystal wafer at a predetermined acute angle with the surface of said crystal wafer; and a portion of said laser beam which is reflected from the surface of said crystal wafer is absorbed by suitable means.

8. A method as in claim 6 and comprising the further steps of:
  placing said crystal wafer in a chamber drawn down to a vacuum prior to scanning said crystal wafer with said laser beam; and
  placing a window in said vacuum chamber to enable said laser beam to pass therethrough and impinge upon the surface of said crystal wafer in said scanning pattern.

9. Apparatus for zone refining a crystal wafer comprising:
  first means of generating a focusable laser beam having a selectable power range;
  second means for focusing said laser beam to a small selectable spot size upon the surface of said crystal wafer;
  third means for scanning said laser beam in a single straight line back and forth across said crystal wafer at a constant relative velocity;
  fourth means of moving said scanning laser beam and said crystal wafer with respect to each other in a direction normal to said single scanning line and at a velocity compatible with said constant relative velocity to substantially uniformly melt said crystal wafer;
  fifth means for directing the laser beam upon the surface of said crystal wafer at an angle not greater than 75° with the surface of said crystal wafer; and
  sixth means for returning the portion of said laser beam reflected from the surface of said crystal wafer back to said surface of said crystal wafer to scan said crystal wafer a second time in a pattern similar to that of the scanning pattern produced by the original, unreflected laser beam but in a direction 180° out of phase with the original scanning pattern.

10. Apparatus as in claim 9 and further comprising:
  seventh means for placing said crystal wafer in a chamber drawn down to a vacuum prior to scanning said crystal wafer with said laser beam; and
  eighth means for placing a window in said vacuum chamber to enable said laser beam to pass therethrough and impinge upon the surface of said crystal wafer in a scanning pattern.

11. Apparatus for zone refining a crystal wafer comprising:
  first means for generating and focusing a laser to a small spot of selectable size on the surface of said crystal wafer;
  second means for scanning said smaller laser beam spot back and forth across said surface of said crystal wafer in a repetitive pattern and at a constant velocity;
  third means for moving said scanning pattern of said laser beam and said crystal wafer at a constant velocity relative to each other and at a direction substantially normal to said repetitive scanning pattern of said laser beam;
  fourth means for directing the laser beam upon the surface of said crystal wafer at an angle not less than 75° with respect to the surface of said crystal wafer; and
  fifth means for returning the portion of said laser beam reflected from the surface of said crystal wafer back to said surface of said crystal wafer to scan said crystal wafer a second time in a pattern similar to that of the scanning pattern produced by the original, unreflected laser beam but in a direction substantially 180° out of phase with the original scanning pattern.

12. Apparatus as in claim 11 and further comprising:
  sixth means for placing said crystal wafer in a chamber drawn down to a vacuum prior to scanning said crystal wafer with said laser beam; and
  seventh means for placing a window in said vacuum chamber to enable said laser beam to pass therethrough and impinge upon the surface of said crystal wafer in a scanning pattern.

13. Apparatus for zone refining a crystal wafer comprising:
  first means for scanning a crystal wafer back and forth in a single line repetitive manner over the same absolute path;
  second means for moving said crystal wafer and said single line repetitive scanning pattern relative to each other and in a direction substantially normal to said single line repetitive scanning pattern and at a constant velocity;
  third means for directing the laser beam upon the surface of said crystal wafer at an angle not less than 75° with respect to the surface of said crystal wafer; and
  fourth means for returning the portion of said laser beam reflected from the surface of said crystal wafer back to said surface of said crystal wafer to scan said crystal wafer a second time in a pattern similar to that of the scanning pattern produced by the original, unreflected laser beam but in a direction substantially 180° out of phase with the original scanning pattern.

14. Apparatus for zone refining a crystal wafer comprising:
  first means for scanning a crystal wafer back and forth in a single line repetitive manner over the same absolute path;
  second means for moving said crystal wafer and said single line repetitive scanning pattern relative to each other and in a direction substantially normal to said single line repetitive scanning pattern and at a constant velocity;
  third means for directing the laser beam upon the surface of said crystal wafer at a predetermined acute angle with the surface of said crystal wafer; and
  fourth means for absorbing the portion of said laser beam reflected from the surface of said crystal wafer by suitable absorbing means.

15. Apparatus as in claim 13 and further comprising:
  fifth means for placing said crystal wafer in a chamber drawn down to a vacuum prior to scanning said crystal wafer with said laser beam; and
  sixth means for placing a window in said vacuum chamber to enable said laser beam to pass therethrough and impinge upon the surface of said crystal wafer in said scanning pattern.

* * * * *

UNITED STATES PATENT AND TRADEMARK OFFICE
CERTIFICATE OF CORRECTION

PATENT NO. : 4,780,590

DATED : October 25, 1988

INVENTOR(S) : Donald B. GRINER et al

It is certified that error appears in the above-identified patent and that said Letters Patent is hereby corrected as shown below:

ON THE COVER PAGE:

Item No. "[73]", delete "Penn Research Corporation, Kennesaw, Ga." and insert therefor --PRC Corporation, Landing, New Jersey--.

Signed and Sealed this

Seventh Day of August, 1990

Attest:

HARRY F. MANBECK, JR.

Attesting Officer

Commissioner of Patents and Trademarks